United States Patent [19]

Ciszek

[11] Patent Number: 5,314,571
[45] Date of Patent: May 24, 1994

[54] CRYSTALLIZATION FROM HIGH TEMPERATURE SOLUTIONS OF SI IN COPPER

[75] Inventor: Theodore F. Ciszek, Evergreen, Colo.

[73] Assignee: Midwest Research Institute, Kansas City, Mo.

[21] Appl. No.: 881,416

[22] Filed: May 13, 1992

[51] Int. Cl.[5] .............................. C30B 9/04
[52] U.S. Cl. ........................ 117/60; 117/64; 117/934
[58] Field of Search ............ 156/621, 624, DIG. 64; 437/119

[56] References Cited

U.S. PATENT DOCUMENTS

| | | |
|---|---|---|
| 2,990,372 | 6/1961 | Pinter et al. |
| 4,088,514 | 5/1978 | Hara et al. ............... 252/623 GA |
| 4,201,623 | 5/1980 | Sumner .................... 156/622 |
| 4,312,848 | 1/1982 | Dawless ................... 156/DIG. 64 |
| 4,447,289 | 5/1984 | Geissler et al. .......... 156/DIG. 64 |
| 4,822,585 | 4/1989 | Dawless ................... 423/348 |

FOREIGN PATENT DOCUMENTS 0073938  3/1983  European Pat. Off. ............ 156/624

*Primary Examiner*—Robert Kunemund
*Attorney, Agent, or Firm*—Ken Richardson

[57] ABSTRACT

A liquid phase epitaxy method for forming thin crystalline layers of device quality silicon having less than $5 \times 10^{16}$ Cu atoms/cc impurity, comprising: preparing a saturated liquid solution melt of Si in Cu at about 16% to about 90% wt. Si at a temperature range of about 800° C. to about 1400° C. in an inert gas; immersing a substrate in the saturated solution melt; supersaturating the solution by lowering the temperature of the saturated solution melt and holding the substrate immersed in the solution melt for a period of time sufficient to cause growing Si to precipitate out of the solution to form a crystalline layer of Si on the substrate; and withdrawing the substrate from the solution.

6 Claims, 2 Drawing Sheets

TO VACUUM OR ARGON INLET

CRYSTALLIZATION FROM HIGH TEMPERATURE SOLUTIONS OF SI IN COPPER

The U.S. Government has rights in this invention pursuant to Contract No. DE.AC02.83CH10093 between the U.S. Department of Energy and the Midwest Research Institute.

BACKGROUND OF THE INVENTION

1. Field Of The Invention

The invention relates generally to a method for forming thin liquid phase epitaxy (LPE) crystalline layers of silicon having less than $5 \times 10^{16}$ Cu atoms/cc impurity by providing a saturated solution of Si in Cu at about 18%.–40% by weight Si at temperatures ranging between about 800° C. about 1150° C.; immersing a silicon substrate in the saturated solution; lowering the temperature of the saturated solution and holding the immersed substrate in the solution for a period sufficient to cause Si to precipitate out of the solution to form a crystalline layer of Si on the substrate; and withdrawing the substrate from the solution.

Growing ingots, wafering, and thin-polishing is not cost effective in providing thin silicon layers and the wafers are fragile to handle. Ribbons of silicon are difficult to grow in such thin geometries and the ribbons are also fragile. On the other hand, growing thin layers on a substrate from the Si melt requires high temperatures and hence high energy input. Furthermore, due to the surface tension of Si, thin flat layers can only be grown on substrates which the silicon wets well, such as graphite; however, this can introduce impurity problems. Moreover, the substrates must be able to withstand a temperature of 1430° C. and small Si grain sizes generally result.

Epitaxial growth of Si on a substrate from a gas phase by chemical vapor deposition is uneconomical because of slow growth rates and plasma vacuum, and sputtering deposition techniques generally result in too small grain sizes.

Therefore, liquid phase epitaxial growth of Si would appear more suitable, if solvent impurities can be adequately avoided.

The method of the present invention entails utilizing LPE by using an improved solvent of Cu in a manner to produce thin crystalline layers of device quality silicon faster, at lower process temperatures, and with improved control of dopant content.

2. The Prior Art

U.S. Pat. No. 4,201,623 discloses a crystal substrate of <111> silicon doped by exposure to a liquid metal solvent, wherein the substrate is carried in a cavity in a refractory boat, and the solvent is carried in a perforation of a cover for the boat; said boat being heated to a certain temperature in a non-oxidizing atmosphere and moved to place the substrate cavity under the cover perforation so that the solvent and substrate come into contact.

A process for growing thin epitaxial layers of Group III-V semiconductor materials is described in U.S. Pat. No. 4,088,514. The process prepares a saturated solution of the semiconductor materials in a metal melt by keeping an under-saturated solution in contact with the crystalline semiconductor material at a predetermined temperature, supercooling the saturated solution and bringing the supercooled solution into contact with a substrate.

U.S. Pat. No. 2,990,372 describes a process for producing silicon of high purity by dissolving silicon in a metal and crystallizing the silicon therefrom. The silicon is dissolved at a temperature in the range of about 700°–1200° C. in a metallic melt used in an amount sufficient for dissolution of the silicon and suitable for crystallization of the silicon upon cooling, wherein the metal melt is of a melt-forming metal and alloys of these metals; including in the melt a dope for the silicon semiconductor; slowly reducing the temperature of the melt including the silicon and dope in order to effect crystallization of the silicon and dope and solidification of the melt; and separating the crystallized dope-containing silicon by dissolving the non-silicon ingredients of the solidified melt in an acid, the melt-forming metal of the metallic melt-silicon solution being present as the principal component of the solution based on the metal-forming metal and silicon content of the solution.

A method of purifying silicon is disclosed in U.S. Pat. No. 4,822,585 which comprises: providing a molten body of a silicon material in a solvent metal of copper; extracting heat from the body to provide a solid phase containing silicon in crystal form and to concentrate impurities in a molten phase; removing a substantial part of the molten phase from the solid phase containing the silicon crystals; subjecting the solid phase to a melting action to melt at least a fraction of the solid phase for purposes of removing a substantial amount of copper-silicon combination adhering to the crystals; and separating at least a fraction of the melted material from the crystals of silicon.

In prior art processes for forming crystalline silicon, there is the requirement of holding the Si melt at relatively high temperatures and this occasions high-power requirements and the higher costs associated therewith. Moreover, in prior art processes for forming crystalline silicon that involve silicon solvents of Ga or In, these processes have suffered from a lack of control over the levels of particular dopant that is desired to be incorporated in the crystalline silicon product.

Liquid phase epitaxy (LPE) is also sometimes called high-temperature solution growth or metal solution growth (if the solvent is a metal), and it has been used since the 1960's in the semiconductor industry for group III-V growth (GaAs, GaP, etc.). Thin layer silicon epitaxy has also been heavily investigated using the solvents of group III's (Al, Ga, In); group V's (Sb, Bi); group IV (Sn); and the metals Au, Cd, Pb, and Ag.

However, a problem with group III and V solvents is that they are also electrical dopants for silicon, and usually lead to difficulties with dopant control. Many metals degrade the minority charge carrier lifetime of the silicon, which is detrimental for most applications. These problems arise because there is some solubility of the solvent element in the grown silicon layer, and this varies with the particular solvent.

A problem with some solvents is that they do not dissolve much silicon and this can lead to excessively slow growth rates.

In the early 1980's, Olson, Carleton, and Tejedor showed the advantageous property of solid Cu-Si alloys to preferentially retain impurities, and used them as source material for bulk polycrystalline Si formation via chemical vapor deposition and electrodeposition of silicon. They were able to refine silicon by both electrodeposition (J. M. Olson and K. L. Carleton, J. Electro-Chem. So. 128 No. 12 (1981) 2699) and by chemical vapor deposition (P. Tejedor and J. M. Olson, J. of Crystal Growth 89 (1988) 220). They were also able to achieve bulk silicon with typically less than 5 ppm impurity compared to their silicon starting material which contained about 1% impurity.

In U.S. Pat. No. 4,822,585, Cu solvent was used to advantage in a liquid phase purification process for bulk silicon.

Therefore, a need exists to provide a method for producing thin crystalline layers of device quality silicon faster, at lower process temperatures, and with improved control of the dopant content.

SUMMARY OF THE INVENTION

It is an object of the invention to provide a method for producing thin crystalline layers of device quality silicon at lower process temperatures.

Another object of the invention is to provide a method for producing thin crystalline layers of device quality silicon at faster rates and at lower process temperatures.

A further object still of the invention is to provide a method for producing thin crystalline layers of device quality silicon faster, at lower process temperatures, and with improved control of the dopant content.

In general, the invention method for producing thin crystalline layers of device quality silicon is carried out at lower temperatures than previous methods to produce crystalline Si incorporating Cu impurity at levels below $5 \times 10^{16}$ Cu, which is the impurity level desirable for devices such as solar cells. The method of the invention provides for greater control of dopant incorporation, and is faster than conventional processes for forming crystalline silicon. In the process of the invention, a liquid saturated solution of Si in Cu is formed with 18% to 40% by weight Si in a suitable inert environment at temperatures in the range from about 850° C. to 1150° C. A substrate is immersed in the melt and a slight cooling of from about 0.5° C. to about 5° C. of the saturated solution precipitates crystalline silicon onto the substrate. After a predetermined time, the coated substrate is withdrawn. During the process of the invention, a $CaCl_2$ layer may be placed on the melt to prevent undesirable crust formation.

BRIEF DESCRIPTION OF THE DRAWING

The foregoing and additional objects, features and advantages of the present invention will become more apparent to those skilled in the art from consideration of the accompanying detailed description of preferred embodiments thereof, taken in conjunction with the accompanying drawings, in which.

DETAILED DESCRIPTION OF THE PREFERRED EMBODIMENTS

Figure 1:
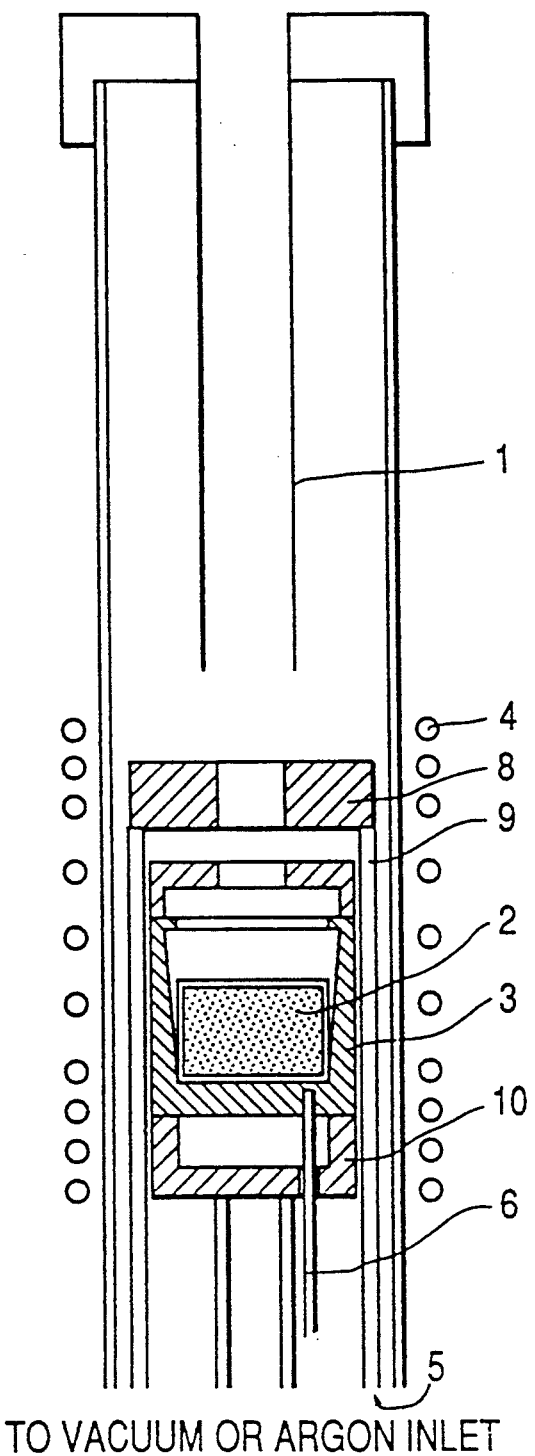
FIG. 1 depicts the apparatus used to perform the method of forming thin crystalline layers of device quality silicon having less than $5 \times 10^{16}$ Cu atoms/cc impurity according to the invention.

In referring to FIG. 1, there is shown an apparatus 7 for drawing thin crystalline layers of device quality silicon having less than $5 \times 10^{16}$ Cu atoms/cc impurity. In using the apparatus, without the quartz crucible or its contents, the pull port 1 and argon exit was plugged with plus 8, and the system was evacuated to about $6 \times 10^{16}$ torr. The system was baked out at about 1200° C. for several hours. The system was cooled again and a 51-mm-dia quartz crucible 2 was loaded with 168.63 g copper shot (5-9's pure), 47.57 g electronic grade Si, and 2.38 g ultradry $CaCl_2$ of 99.995% purity. The loaded crucible was placed in a graphite susceptor 3, whereupon the pull port was again plugged and the system was evacuated to $9 \times 10^{-16}$ torr. The charge was heated to 263° C. under vacuum, whereupon the RF power from RF coil 4 and the vacuum pumps (not shown) were turned off and high-purity argon was admitted into the system through the argon inlet 5. After reaching 2 psi above room temperature pressure the pull port was unplugged to permit the purging argon gas to continuously exit from the pull port or argon exit 9. The RF power was turned on again and the system was heated to 1160° C. to melt the Cu and $CaCl_2$ and to dissolve the Si in the Cu. The temperature was lowered to about 1000° C., and the vertical temperature profiles in the melt were made with a vertically adjustable quartz sheathed thermocouple. The RF coil position was adjusted until the vertical profile was nearly isothermal, but with the topmost region of the melt about 2° C. hotter than the lower regions of the melt, whereupon the profiling thermocouple was removed. The temperature of the melt was further reduced to determine the control temperature (read by the thermocouple 6 in FIG. 1, but not necessarily the same as the temperature in the melt) at which the melt was supersaturated and would begin to precipitate Si floating on the surface. The temperature was again raised to redissolve the Si and then lowered to a selected starting temperature for growth.

A vertical <111> Si substrate about 12 mm wide and 40 mm long was partially immersed at a control temperature of 942.6° C., and the temperature was dropped to 940.4° C. over a 40 second time period. The sample was withdrawn after a total time of 5 minutes in the melt; however, it was found that the selected starting temperature was too hot, and only partial dissolving of the substrate was achieved.

Another <111> Si substrate was immersed 20 mm at a stable control temperature of 940.9° C., and the temperature was lowered to 934.5° C. over a 4-minute, 40-second time period. After a total immersion time of 14 minutes and 20 seconds, the substrate was withdrawn. It was observed that the substrate was first very slightly dissolved at its surface, and that a subsequent LPE layer was uniformly grown to a thickness of about 25 μm.

Other layers were subsequently grown at slightly different cooling rates and starting temperatures. Thicknesses between 4 and 41 μm were achieved. It was found that smoother, melt-inclusion free layers are favored by slower cooling rates (using longer times if necessary to achieve thick layers), and that the open pull port, laminarly purged with argon, permits many substrates to be coated sequentially.

In FIG. 1, element 10 is a graphite support.

Figure 2:
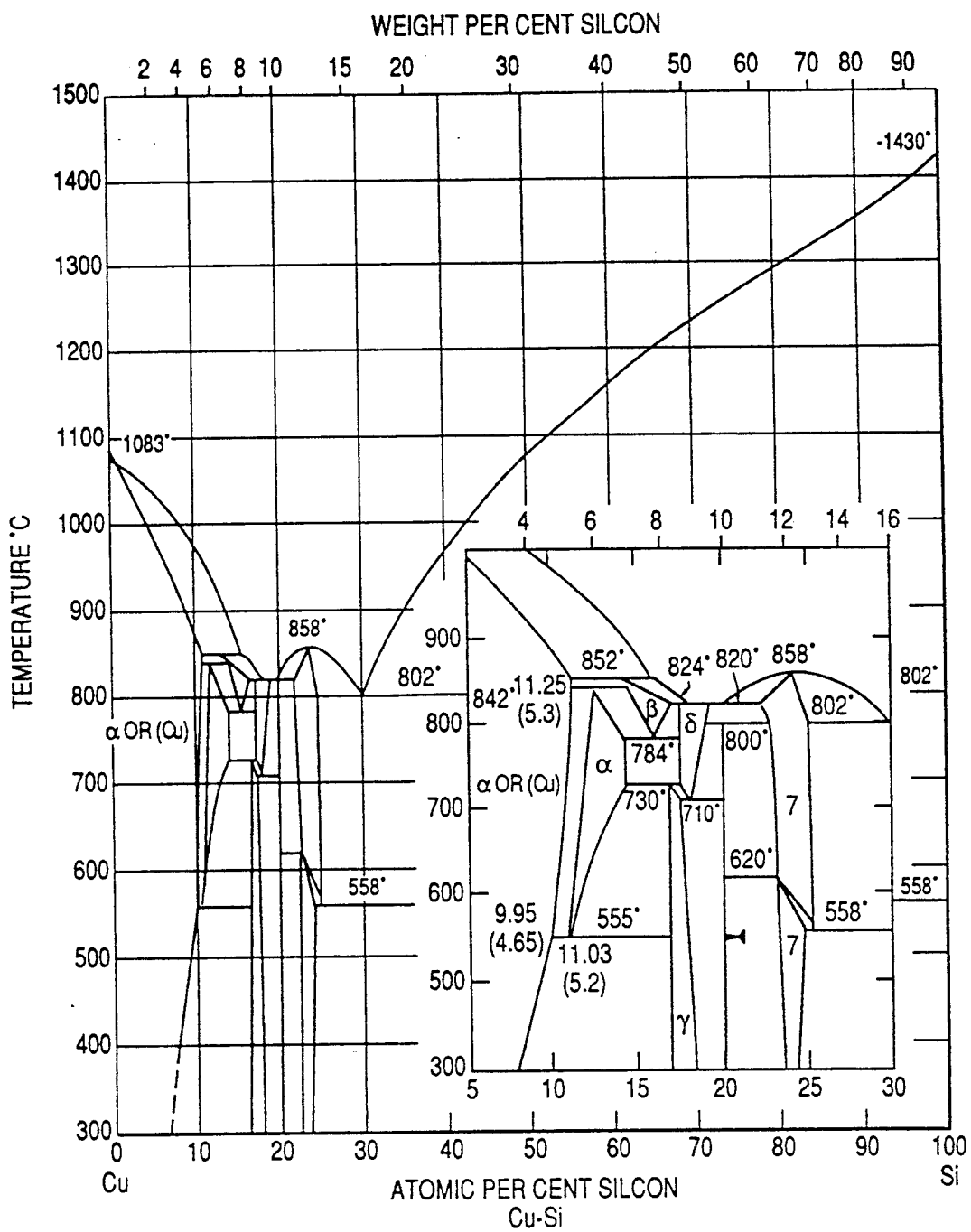
FIG. 2 is a phase diagram governing the growth of Si from Cu solutions at temperatures between 800° C. and 1430° C., and Si contents between 16 wt. % and 100 wt. %.

Solidification. The liquidus consists of four branches corresponding to the crystallization of $\alpha$, $\beta$, $\eta$, and Si. The latter, which has not been determined again, is shown in FIG. 2. Sanfourche[1] detected the liquidus curve of the δ phase which was overlooked by Matuyama.[2] The liquidus curve and peritectic and eutectic equilibria, which are based on the careful work of Smith[3,4]), covering the range 0-20 wt. (36 at.) % Si, were used in drawing the diagram in FIG. 2.

[1] A. Sanfourche, Rev. met., 16, 1919, 246.256. [2] K. Matuyama, Science Repts. Tohoku Univ., 17, 1928, 665-673. [3] C. S. Smith, J. Inst. Metals, 40, 1928, 359-371. [4] C. S. Smith, Trans. AIME, 83, 1929, 414-439.

The α0 Phase. The solids curve (FIG. 2), based on micrographic work, shows the solid solubility of Si in Cu as determined by Corson[5], Smit[6], Iokibe[7], Crepas[8], Sautner[9], Isawa[10,11]) and Andersen.[12] Results by Corson (1927), Smith (1928), Iokibe (1931) and Crepas (1931), obtained by micrographic analysis, are obsolete; since these investigators did not recognize the existence of the α phase, their solubility curves above 500°-600° C. lie close to the high-Si boundary of this phase. The micrographically determined curve by Smith (1940) (FIG. 2) is generally accepted at present. The curve by Andersen (1940), based on lattice-spacing data, coincides with that by Smith (1940) at temperatures below 500° C., but deviates somewhat at higher temperatures. The curve reported By Sautner (1933) lies rather close to those by Smith (1940) and Andersen (1940), at temperatures between 500° C. and 700° C. Solubilities determined parametrically by Isawa (1938, 1940) are lower under 700° C. than those reported by Smith (1940)—largest deviation at 500° C. is about 0.9 wt. (1.9 at.) %—but must be regarded as less accurate.

[5] M. G. Corson, Trans. AIME, Proc. Inst. Metals Div., 1927, 435-440. [6] C. S. Smith, Trans. AIME, 137, 1940, 313-329. [7] K. Iokibe, Kinzoku-no-Kenkyu, 8, 1931, 433-45. [8] E. Crepas, Metallurgia ital., 23, 1931, 711-716. [9] K. Sautner, Forschungsarb. Metallkunde u. Rontgenmetallog., no. 9, 1933. [10] T. Isawa, Nippon Kinzoku Gakkai-Shi, 2, 1938, 400-409. [11] T. Isawa, Nippon Kinzoku Gakkai-Shi, 4, 1940, 398-404. [12] A. G. H. Andersen, Trans. AIME, 137, 1940, 334-350.

The χ Phase. The existence of an additional phase between 10 and 15 at. % Si, overlooked by all investigators prior to 1933, was first suspected by Voce[13] and Schwarz.[14] Kaiser et al.[15] found that the solubility of Si at 725° C., based on lattice-parameter measurements, was only about 11.6 at. %, i.e., 2.4 at. % less than the solubility reported by Smith (1928), then accepted as most accurate data. By X-ray investigation, Sautner (1933) proved beyond doubt that an additional phase was present around 12.5 at. % Si. Its existence was confirmed by Isawa (1938) and Okamoto[16] and later investigators Isawa (1940), Smith (1940), Andersen (1940), Takamoto[17] and Hofmann et al.[18]

[13] E. Voce, J. Inst. Metals, 44, 1930, 331-361; see also 387-388. [14] M. v. Schwarz, Z. Metallkunde, 24, 1932, 124-126. [15] H. F. Kaiser and C. S. Barrett, Phys. Rev., 37, 1931, 1697. [16] M. Okamoto, Science Repts. Tohoku Univ., 27, 1938, 155-161. [17] N. Takamoto, Nippon Kinzoku Gakkai-Shi, 4, 1940, 198-200. [18] W. Hofmann, J. Ziegler, and H. Hanemann, Z. Metallkunde, 42, 1951, 55-57; work done in 1941-1942.

Although Sautner (1933) had suggested the χ phase to be a high-temperature phase, Isawa (1938) believed it to be stable down to room temperature. Okamoto (1938) first proved that χ decomposes eutectoidally into α+γ. Its decomposition temperature was determined as 552 (Smith (1940), 557 (Andersen (1940)), 590 (Isawa (1940)), and 555° C. (Takamoto (1940)) and the eutectoid point as 11.05 (Smith (1940)), 10.8 (Andersen (1940)), 12.2 (Isawa (1940), and 10.9 at. % Si (Takamoto (1940)). The χ-phase field was established by Smith (1940), Andersen (1940), Isawa (1940) and Takamoto (1940); that shown in FIG. 2 is due to Smith (1940). The χ=α+γ transformation is extremely sluggish Isawa (1938) and Hofmann et al. (1951)); it was studied by Hibbard et al.[19] and Hopkins.[20]

[19] W. R. Hibbard, G. H. Eichelman, and W. P. Saunders, Trans. AIME, 180, 1949, 92-100. [20] A. D. Hopkins, J. Inst. Metals, 82, 1953-1954, 163-165.

In FIG. 2, as relates to the crystal structures, the lattice parameters of the α phase increases from a=3.615 Å at 0% Si to a=3.622 Å at 11.7 at. % Si.

The χ phase is h.c.p. (A3 type) (Arrhenius et al.[21], Sautner (1933), Isawa (1938) and Andersen (1940)), with a=2.559 Å, c=4.185 Å, c/a=1.635 at 11.8 at. % Si and a=2.562 Å, C=4.182 Å, c/a=1.632 at 14.0 at. % Si (Andersen (1940)).

The β phase, a 3:2 electron compound (Hume-Rothery et al.[22]), is b.c.c. of the A2 type, a=2.854 Å at 14.9 at. % Si (Isawa (1938)).

The γ phase is cubic of the β-Mn (A13) type (arrhenius et al. (1931), Sautner (1933), Fagerberg et al.[23] and Isawa (1940)), a=6.222 Å (Smith (1929) and Fagerberg et al. (1935)), a=6.198 Å (Isawa (1940)).

[21] S. Arrhenius and A. Westgren, Z. physik. Chem., B14, 1931, 66-79. [22] W. Hume-Rothery, P. W. Reynolds, and G. V. Raynor, J. Inst. Metals, 66, 1940, 191-207. [23] S. Fagerberg and A. Westgren, Metallwirtschaft, 14, 1935, 265-267.

Alloys with 15-30 At. % Si. By means of thermal and microscopic studies, Smith (1929) established the presently accepted phase relationships in this range, with the exception that the ε phase was not included. This phase was first detected by a comprehensive X-ray analysis (Arrhenius et al. (1931)). It was suggested that ε is formed by a peritectoid reaction of γ and η at 620° C., since no X-ray evidence was found for the transformation of the η phase, first reported by Sanfourche (1919) and confirmed by Smith (1940). The partial phase diagram (0-35 at. % Si) By Iokibe (1931), based on thermal, resistomertric, dialatomertric, and microscoppic data, is very similar to that by Smith (1940), with the exception that the ε phase (Arrhenius et al. (1931)) was introduced and shown to be formed by a peritectoid reaction of δ and η at 800° C. (FIG. 2). In addition the η phase was reported to undergo two transformations.

The Si Phase. The solidus curve, as calculated by Matsuyama[24], is retrograde and indicates solubilities of about 0.003, 0.0008, and 0.00009 at. & Cu at about 1330, 1030, and 800° C., respectively. (M. Hansen and K. Anderko Constitution of binary Alloys, 2nd ed., McGraw-Hill, N.Y., pp. 630-633 (1985).)

[24] K. Matsuyama, Kinzoku-no-Kenkyu, 11, 1934, 466-469.

In the process of the invention, when Cu is used as the solvent for Si liquid phase epitaxy the following advantages are apparent:

The ability of Cu/Si alloy to retain impurities mentioned;

the relatively high solvent power of copper for silicon (about 0.05 wt. % Si per ° C. near 930° C., where the composition is about 2 wt. % Si—as shown in the phase diagram of FIG. 2, and this compares to about 0.007 wt. % Si per ° C. for Si in a tin solvent near 930° C., where the composition is about 2 wt. % Si);

The low growth temperature (typically 900°-950° C., but the range 800°-1400° C. is feasible—as shown in phase diameter of FIG. 2);

The low solid solubility of the Cu solvent in Si (the solubility of Cu in Si at 900° C. is $1 \times 10^{17}$ atoms/cm$^3$ compared to $1.5 \times 10^{19}$ for Al, $2 \times 10^{19}$ for Ga, and $4 \times 10^{19}$ for Sn; ref: F. A. Trumbore, Bell System Technical Journal, Jan. 1960);

The minimal effect on Si resistivity since it is not a doping element; and

The minimal effect on minority carrier lifetime or solar cell efficiency at the expected Cu concentrations in the grown layers (from above, $<1 \times 10^{17}$ atoms/cm$^3$ is expected; according to Davis et al, IEEE Transactions on Electron Devices ED-27 (1980) 677, more than $1 \times 10^{17}$ Cu content is required before degradation in these parameters is seen).

The parameters of the LPE process of the invention may be summarized in an operative context via the following sequence:

Forming a saturated solution of Si in Cu at 30% to 95% atomic % Si (16% –90% wt. % Si); preferably the range is 30% to 50% atomic % or 16–32% wt. %. The corresponding temperatures will be 802° C. to 1400° C. or preferably 802° C. to 1800° C.; most preferably we use 19–22 wt. % Si at 900°–960° C. A suitable inert ambient such as argon must be provided;

Slowly supersaturating the solution in the presence of a suitable substrate by lowering the temperature gradually (typically 0.2°–6.0° C.) over a period of 2 to 20 minutes;

Growing a thin silicon layer on the substrate due to the driving force of lowering the temperature;

After a suitable thickness of growth, withdrawing the substrate from the solution, because thicker growth occurs with larger temperature drops and longer times; and Controlling the temperature and thermal gradient, as these are crucial. A clean melt surface is necessary to prevent spurious nucleation of silicon, and this is achieved by using a thin liquid $CaCl_2$ layer (MP 782° C.) to cover the melt, wherein the substrate is inserted through this layer into the melt.

While many substrates will work in the context of the invention, a silicon substrate is preferred for highest quality films.

In the context of the invention process, various geometries are possible; however, we typically use a dipping technique, where the substrates are positioned either vertically or horizontally and are lowered downward into a crucible containing the melt. Any of the slider-boat or tipping-boat geometries routinely used in LPE may also be applied, i.e. the tipping-boat technique.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

I claim:

1. A liquid phase epitaxy method for forming thin crystalline layers of device quality silicon having less than $5 \times 10^{16}$ Cu atoms/cc impurity, comprising:
    a) preparing saturated liquid solution melt of Si in Cu at about 16% to about 90% wt. Si at a temperature range of about 800° C. to about 1400° C. in an inert gas;
    b) applying a liquid $CaCl_2$ layer to cover said solution melt;
    c) immersing or partially immersing a substrate in said saturated solution melt;
    d) supersaturating the solution by lowering the temperature of said saturated solution melt and holding said substrate immersed or partially immersed in said solution melt for a period of time sufficient to cause growing Si to precipitate out of said solution to form a crystalline layer of Si on said substrate; and
    e) withdrawing said substrate from said solution; said liquid $CaCl_2$ placed on said melt prevents spurious nucleation of silicon.

2. The process of claim 1, wherein the Si in Cu is present in amounts of about 16% to about 32% wt. Si, and wherein said temperature range is between about 802° C. to about 1080° C.

3. The process of claim 1, wherein the Si in Cu is present in amounts of about 19% to about 22% wt. Si, and wherein said temperature range is between about 900° to about 960° C.

4. The process of claim 3, wherein the substrate is silicon and the inert gas is argon.

5. The process of claim 4, wherein in step c) the temperature is lowered gradually over a period of time in increments of from about 0.2° C. to about 6.0° C.

6. The process of claim 5, wherein the period of time is from about 2 minutes to about 20 minutes.

* * * * *